United States Patent
Yoshida

(10) Patent No.: US 10,996,260 B2
(45) Date of Patent: May 4, 2021

(54) SEMICONDUCTOR TEST CIRCUIT, SEMICONDUCTOR TEST APPARATUS, AND SEMICONDUCTOR TEST METHOD

(71) Applicant: FUJI ELECTRIC CO., LTD., Kawasaki (JP)

(72) Inventor: Mitsuru Yoshida, Shiojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 281 days.

(21) Appl. No.: 16/175,075

(22) Filed: Oct. 30, 2018

(65) Prior Publication Data
US 2019/0064249 A1 Feb. 28, 2019

Related U.S. Application Data

(63) Continuation of application No. PCT/JP2017/036335, filed on Oct. 5, 2017.

(30) Foreign Application Priority Data

Nov. 16, 2016 (JP) .............................. JP2016-222878

(51) Int. Cl.
*G01R 31/26* (2020.01)

(52) U.S. Cl.
CPC ..... *G01R 31/2608* (2013.01); *G01R 31/2632* (2013.01)

(58) Field of Classification Search
CPC ........................ G01R 31/2608; G01R 31/2632
See application file for complete search history.

(56) References Cited

U.S. PATENT DOCUMENTS 5,360,984 A * 11/1994 Kirihata ............. H01L 27/0617
257/139
6,208,185 B1 * 3/2001 John .................. H03K 17/0406
327/170
(Continued)

FOREIGN PATENT DOCUMENTS

CN 102539992 A 7/2012
CN 202815167 U 3/2013
(Continued)

OTHER PUBLICATIONS

International Search Report dated Jan. 9, 2018 in corresponding International Application No. PCT/JP2017/036335.
(Continued)

*Primary Examiner* — Walter L Lindsay, Jr.
*Assistant Examiner* — Milton Gonzalez

(57) ABSTRACT

A semiconductor test circuit, apparatus, and method having a first relay disposed between a power supply and a switching element, a second relay disposed between a connection point of the switching element and a reverse conducting-insulated gate bipolar transistor (RC-IGBT) chip and a snubber circuit, a third relay disposed between the switching element and the RC-IGBT chip and a coil, and a fourth relay disposed between a diode and the switching element. A turn on/off test of an IGBT portion is performed by turning on the second and fourth relays. An avalanche test of the IGBT portion is performed by turning on the second relay. A short-circuit test of the IGBT portion is performed by turning on the first relay. A recovery test of an FWD portion is performed by turning on the first and third relays. At this time probes are brought into contact with electrodes once.

21 Claims, 13 Drawing Sheets

(56) References Cited

U.S. PATENT DOCUMENTS

| | | | |
|---|---|---|---|
| 7,701,241 B2* | 4/2010 | Kumagai | G01R 31/2889 |
| | | | 324/750.3 |
| 8,610,446 B2* | 12/2013 | Yoshida | G01R 31/129 |
| | | | 324/750.14 |
| 8,970,235 B2* | 3/2015 | Yoshida | G01R 31/42 |
| | | | 324/750.16 |
| 2007/0170549 A1 | 7/2007 | Tsuzuki et al. | |
| 2012/0081139 A1 | 4/2012 | Yoshida | |
| 2015/0249083 A1 | 9/2015 | Okawara et al. | |
| 2016/0025802 A1* | 1/2016 | Sicard | G01R 31/2608 |
| | | | 324/762.08 |
| 2017/0023636 A1* | 1/2017 | Takita | G01R 1/0408 |

FOREIGN PATENT DOCUMENTS

| | | |
|---|---|---|
| CN | 204462194 U | 7/2015 |
| CN | 105023943 A | 11/2015 |
| CN | 105185826 A | 12/2015 |
| CN | 105206656 A | 12/2015 |
| CN | 105277865 A | 1/2016 |
| DE | 3832273 A1 * 3/1990 ......... G01R 31/2628 |
| EP | 2437076 A2 | 4/2012 |
| JP | 2007-214541 A | 8/2007 |
| JP | 2010-107432 A | 5/2010 |
| JP | 2012-78174 A | 4/2012 |
| JP | 2015-165541 A | 9/2015 |
| JP | 2015-232501 A | 12/2015 |
| JP | 2016-4015 A | 1/2016 |
| JP | 2017-223480 A | 12/2017 |

OTHER PUBLICATIONS

Chinese Office Action dated May 8, 2020, in corresponding Chinese Patent Application No. 201780024970.7.

Japanese Office Action dated Oct. 1, 2019 in corresponding Japanese Patent Application No. 2018-551070.

* cited by examiner

| TEST ITEM | RL1 | RL2 | RL3 | RL4 | RL5 | RL6 |
|---|---|---|---|---|---|---|
| TURN ON/OFF | OFF | ON | OFF | ON | OFF | OFF |
| AVALANCHE | OFF | ON | OFF | OFF | OFF | OFF |
| RECOVERY | ON | OFF | ON | OFF | ON | ON |
| SHORT-CIRCUIT | ON | OFF | OFF | OFF | OFF | OFF |

FIG. 3

TEST RESULT DATA TABLE

| TEST ITEM | 1 | 2 | 3 | 4 | 5 | 6 | 993 | 994 | 995 | 996 | 997 | 998 | 9 | TOTAL | ORDER |
|---|---|---|---|---|---|---|---|---|---|---|---|---|---|---|---|
| TURN ON/OFF TEST (A) | P | P | F | P | P | P | P | P | P | P | | | | 4 | 3 |
| AVALANCHE TEST (B) | P | P | | P | P | P | F | P | P | P | | | | 2 | 4 |
| RECOVERY TEST (C) | P | P | | P | P | F | | P | P | P | | | | 6 | 2 |
| SHORT-CIRCUIT TEST (D) | P | P | | P | P | | | P | F | P | | | | 11 | 1 |

P: PASS / F: FAIL

ORDER SETTING TABLE

| TEST ITEM | ORDER |
|---|---|
| FIRST TEST | A |
| SECOND TEST | B |
| THIRD TEST | C |
| FOURTH TEST | D |

ORDER SETTING TABLE

| TEST ITEM | ORDER |
|---|---|
| FIRST TEST | D |
| SECOND TEST | C |
| THIRD TEST | A |
| FOURTH TEST | B |

SEMICONDUCTOR TEST CIRCUIT, SEMICONDUCTOR TEST APPARATUS, AND SEMICONDUCTOR TEST METHOD

CROSS-REFERENCE TO RELATED APPLICATIONS

This application is a continuation application of International Application PCT/JP2017/036335 filed on Oct. 5, 2017 which designated the U.S., which claims priority to Japanese Patent Application No. 2016-222878, filed on Nov. 16, 2016, the entire contents of which are incorporated herein by reference.

BACKGROUND

1. Field

The embodiments discussed herein are related to a semiconductor test circuit, a semiconductor test apparatus, and a semiconductor test method which continuously perform a plurality of dynamic characteristic tests of a semiconductor chip while minimizing damage to the semiconductor chip caused by contact of a probe with the semiconductor chip.

2. Related Art

After a wafer is diced into individual power semiconductor chips, a dynamic characteristic test is performed on each power semiconductor chip. By doing so, all chip sorting is performed. A power metal-oxide-semiconductor-field-effect-transistor (MOSFET), an insulated gate bipolar transistor (IGBT), a freewheeling diode (FWD), or the like is known as a power semiconductor chip. With a power MOSFET or an IGBT, a load made up of a coil, a diode, and a resistor or a capacitor is connected in series with it and a turn-on/off signal is applied to its gate. By doing so, a dynamic characteristic test is performed (see, for example, Japanese Laid-open Patent Publication No. 2010-107432). With an FWD, a load coil and a switching element are connected in the same way in series with it and switching of the switching element is performed. By doing so, a dynamic characteristic test is performed (see, for example, Japanese Laid-open Patent Publications No. 2010-107432 and No. 2015-232501).

By the way, a reverse conducting-IGBT (hereinafter referred to as an RC-IGBT) formed by integrating an IGBT portion and an FWD portion onto one chip, has been developed as a power semiconductor chip. With this RC-IGBT, a dynamic characteristic test is performed on each of the IGBT portion and the FWD portion. However, dynamic characteristic tests are performed on the IGBT portion and the FWD portion by the use of an IGBT test apparatus and an FWD test apparatus respectively. That is to say, first an RC-IGBT chip is placed on a test electrode of the IGBT test apparatus a collector electrode down. Probes are brought into contact with an emitter electrode and a gate electrode of the RC-IGBT chip. By doing so, a dynamic characteristic test is performed on the IGBT portion. Next, the RC-IGBT chip is shifted to the FWD test apparatus. The RC-IGBT chip is placed on a test electrode of the FWD test apparatus a cathode (collector) electrode down. A probe is brought into contact with an anode (emitter) electrode of the RC-IGBT chip. By doing so, a dynamic characteristic test is performed on the FWD portion.

However, conventional tests performed on RC-IGBT chips go through two test processes. As a result, a probe is brought into contact with an emitter electrode two times. This increases the number of marks made by contact with a probe. Furthermore, an RC-IGBT chip is positioned a total of two times in two test apparatuses and is shifted from one test apparatus to the other. This leads to a long test time.

SUMMARY

According to an aspect, there is provided a semiconductor test circuit for performing a characteristic test of an RC-IGBT chip onto which an IGBT portion and an FWD portion are integrated, including a power supply, a first semiconductor switching element connected to a collector of the RC-IGBT chip, a first coil connected between a positive electrode terminal of the power supply and the first switching element, a first diode connected in parallel with the first coil and having a cathode connected to the positive electrode terminal of the power supply, a snubber circuit connected between the collector and an emitter of the RC-IGBT chip, a second coil connected between the collector and the emitter of the RC-IGBT chip, a first relay connected in parallel with the first coil, a second relay connected between the collector of the RC-IGBT chip and the snubber circuit, a third relay connected between the collector of the RC-IGBT chip and the second coil, and a fourth relay connected in series with the first diode.

Additional aspects and/or advantages will be set forth in part in the description which follows and, in part, will be apparent from the description, or may be learned by practice of the claimed invention.

It is to be understood that both the foregoing general description and the following description of embodiments provide illustrative examples and explanations and are not restrictive of the claimed invention.

BRIEF DESCRIPTION OF THE DRAWINGS

FIG. 3 illustrates the operating state of each relay;

DESCRIPTION OF EMBODIMENTS

A case where an embodiment is applied to the test of an RC-IGBT chip will now be described in detail as an example with reference to the accompanying drawings. As long as there is no inconsistency, a plurality of embodiments may partially be combined.

Figure 1:
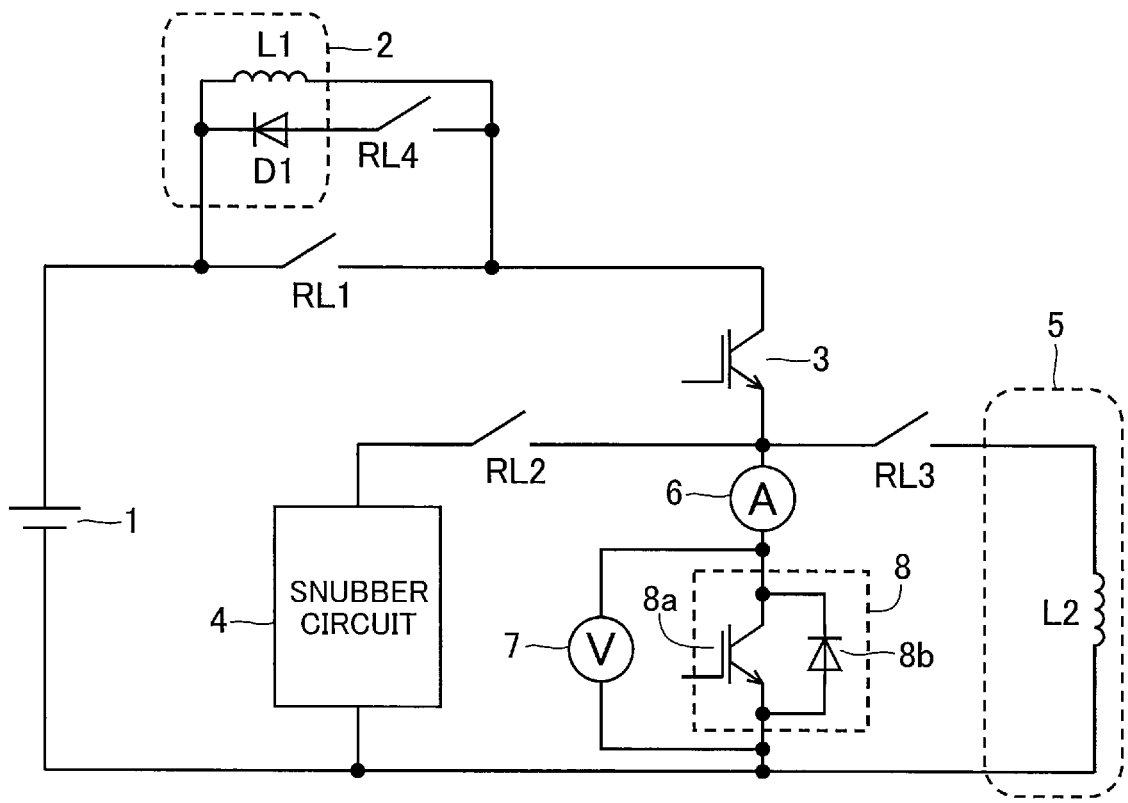
FIG. 1 is a circuit diagram illustrative of an example of a semiconductor test circuit according to a first embodiment.

FIG. 1 is a circuit diagram illustrative of an example of a semiconductor test circuit according to a first embodiment.

A semiconductor test circuit according to a first embodiment includes a power supply 1, an IGBT characteristic test load 2, a semiconductor switching element 3, a snubber circuit 4, an FWD characteristic test load 5, an ammeter 6, a voltmeter 7, and relays RL1, RL2, RL3, and RL4. A device tested by this semiconductor test circuit is an RC-IGBT chip 8. A dynamic characteristic test is performed on each of an IGBT portion 8a and an FWD portion 8b of the RC-IGBT chip 8. The IGBT characteristic test load 2 includes a coil L1 and a diode D1. In this embodiment, an IGBT is used as the switching element 3. The FWD characteristic test load 5 includes a coil L2.

In this semiconductor test circuit, a positive electrode terminal of the power supply 1 is connected to one terminal of the relay RL1 and the other terminal of the relay RL1 is connected to a collector of the switching element 3. Furthermore, the one terminal of the relay RL1 is connected to one terminal of the coil L1 of the IGBT characteristic test load 2 and a cathode of the diode D1 of the IGBT characteristic test load 2. An anode of the diode D1 is connected to one terminal of the relay RL4. The other terminal of the relay RL4 is connected to the other terminal of the coil L1 and the other terminal of the relay RL1.

An emitter of the switching element 3 is connected to one terminal of the relay RL2 and the other terminal of the relay RL2 is connected to one terminal of the snubber circuit 4. The other terminal of the snubber circuit 4 is connected to a negative electrode terminal of the power supply 1.

Furthermore, the emitter of the switching element 3 is connected to one terminal of the relay RL3 and the other terminal of the relay RL3 is connected to one terminal of the coil L2 of the FWD characteristic test load 5. The other terminal of the coil L2 is connected to the negative electrode terminal of the power supply 1.

In addition, the emitter of the switching element 3 is connected to one terminal of the ammeter 6. The other terminal of the ammeter 6 is connected to a collector of the IGBT portion 8a of the RC-IGBT chip 8 and a cathode of the FWD portion 8b of the RC-IGBT chip 8 (hereinafter these may be referred to as a collector of the RC-IGBT chip 8). An emitter of the IGBT portion 8a of the RC-IGBT chip 8 and an anode of the FWD portion 8b of the RC-IGBT chip 8 (hereinafter these may be referred to as an emitter of the RC-IGBT chip 8) are connected to the negative electrode terminal of the power supply 1. Furthermore, the other terminal of the ammeter 6 is connected to one terminal of the voltmeter 7 and the other terminal of the voltmeter 7 is connected to the negative electrode terminal of the power supply 1.

With this semiconductor test circuit, a turn on/off test, an avalanche test, and a short-circuit test are performed on the IGBT portion 8a of the RC-IGBT chip 8 and a recovery test is performed on the FWD portion 8b of the RC-IGBT chip 8. In order to perform each test, a circuit is switched by switching the relay RL1, RL2, RL3, or RL4.

First a turn on/off test is performed on the IGBT portion 8a. At this time, the relays RL1 and RL3 are turned off and the relays RL2 and RL4 are turned on. As a result, the positive electrode terminal of the power supply 1 is connected to the collector of the RC-IGBT chip 8 via a circuit made up of the coil L1 and the diode D1 of the IGBT characteristic test load 2 connected in parallel, the switching element 3, and the ammeter 6. Furthermore, the collector of the RC-IGBT chip 8 is connected to the one terminal of the snubber circuit 4. The negative electrode terminal of the power supply 1 is connected to the emitter of the RC-IGBT chip 8 and the other terminal of the snubber circuit 4. The snubber circuit 4 is used for suppressing a turn-off surge voltage generated at the time of the turn on/off test performed on the IGBT portion 8a.

With the turn on/off test, the switching element 3 is kept on and an on/off signal is applied to a gate of the IGBT portion 8a. At this time, a change in current is observed by the ammeter 6 and a change in voltage is observed by the voltmeter 7.

When an avalanche test is performed on the IGBT portion 8a, the relays RL1, RL3, and RL4 are turned off and the relay RL2 is turned on. That is to say, the coil L1 and the diode D1 of the IGBT characteristic test load 2 are connected in parallel at the time of the turn on/off test. At the time of the avalanche test, however, the diode D1 is removed.

With the avalanche test, the switching element 3 is kept on and an on/off signal is applied to the gate of the IGBT portion 8a. A phenomenon in which energy stored in the coil L1 is given to the collector at the moment the IGBT portion 8a is turned off is observed especially with the avalanche test.

When a short-circuit test is performed on the IGBT portion 8a, the relays RL2, RL3, and RL4 are turned off and the relay RL1 is turned on. With the short-circuit test, the switching element 3 is kept on and an on signal is applied to the gate of the IGBT portion 8a for a short period of time. The short-circuit tolerance of the IGBT portion 8a at this time is observed.

When a recovery test is performed on the FWD portion 8b, the relays RL2 and RL4 are turned off and the relays RL1 and RL3 are turned on. As a result, the positive electrode terminal of the power supply 1 is connected to the switching element 3, to the cathode of the FWD portion 8b of the RC-IGBT chip 8 via the ammeter 6, and to the one terminal of the coil L2 of the FWD characteristic test load 5. The negative electrode terminal of the power supply 1 is connected to the anode of the FWD portion 8b and the other terminal of the coil L2.

When the switching element 3 is repeatedly turned on and off, the FWD portion 8b goes into an energized state in spite of a reverse bias. With the recovery test, this phenomenon is observed. That is to say, even when a bias direction changes in a state in which the FWD portion 8b is forward-biased and therefore the FWD portion 8b is reverse-biased, a reverse current flows due to energy stored in the coil L2. With the recovery test, the length of time for which a reverse current flows is measured.

Figure 2:
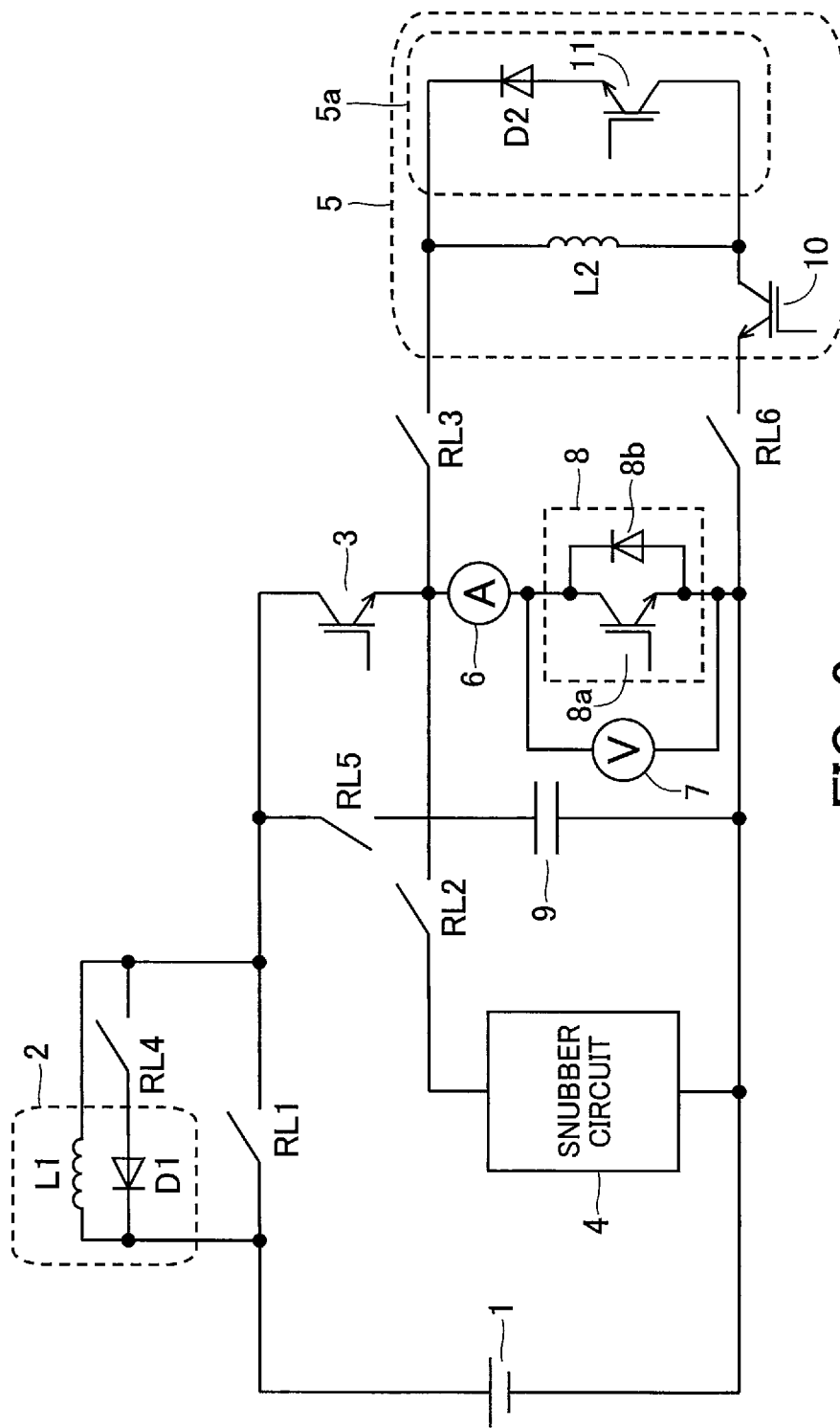
FIG. 2 is a circuit diagram illustrative of an example of a semiconductor test circuit according to a second embodiment.

FIG. 2 is a circuit diagram illustrative of an example of a semiconductor test circuit according to a second embodiment. Components in FIG. 2 which are the same as or equivalent to those illustrated in FIG. 1 are marked with the same numerals and detailed descriptions of them will be omitted according to circumstances.

A semiconductor test circuit according to a second embodiment differs from the semiconductor test circuit according to the first embodiment in that the function of a test of an FWD portion 8b is added. That is to say, with the semiconductor test circuit according to the second embodiment a capacitor 9, semiconductor switching elements 10 and 11, relays RL5 and RL6, and a diode D2 are newly added.

In this semiconductor test circuit, one terminal of the relay RL5 is connected to a connection point of a relay RL1 and a switching element 3 and the other terminal of the relay RL5 is connected to one terminal of the capacitor 9. The other terminal of the capacitor 9 is connected to an emitter of an RC-IGBT chip 8. A circuit made up of the relay RL6 and the switching element 10 connected in series is connected between the emitter of the RC-IGBT chip 8 and the other terminal of a coil L2 of an FWD characteristic test load 5. The switching element 10 sets a direction in which a current flows to the direction from the coil L2 to the emitter of the RC-IGBT chip 8. Furthermore, in the FWD characteristic test load 5, a circuit made up of the switching element 11 and the diode D2 connected in series is connected in parallel with the coil L2. The switching element 11 and the diode D2 set a direction in which a current flows to, as in the FWD portion 8b, the direction from a negative electrode terminal of a power supply 1 to the switching element 3. In this embodiment IGBTs are used as the switching elements 10 and 11. In addition, the voltage of the power supply 1 is VCC.

The capacitor 9 is disposed very near to the RC-IGBT chip 8 and is used for suppressing fluctuations in the voltage of the power supply 1. The switching element 10 is used for stopping a reflux current. The switching element 11 and the diode D2 make up a commutation circuit 5a to which the reflux current is commutated. The semiconductor test circuit includes a relay control drive circuit (not illustrated) for on-off controlling the relays RL1 through RL6 and a switching control circuit (not illustrated) for on-off controlling the switching elements 3, 10, and 11.

The operation of this semiconductor test circuit will now be described.

Figure 4:
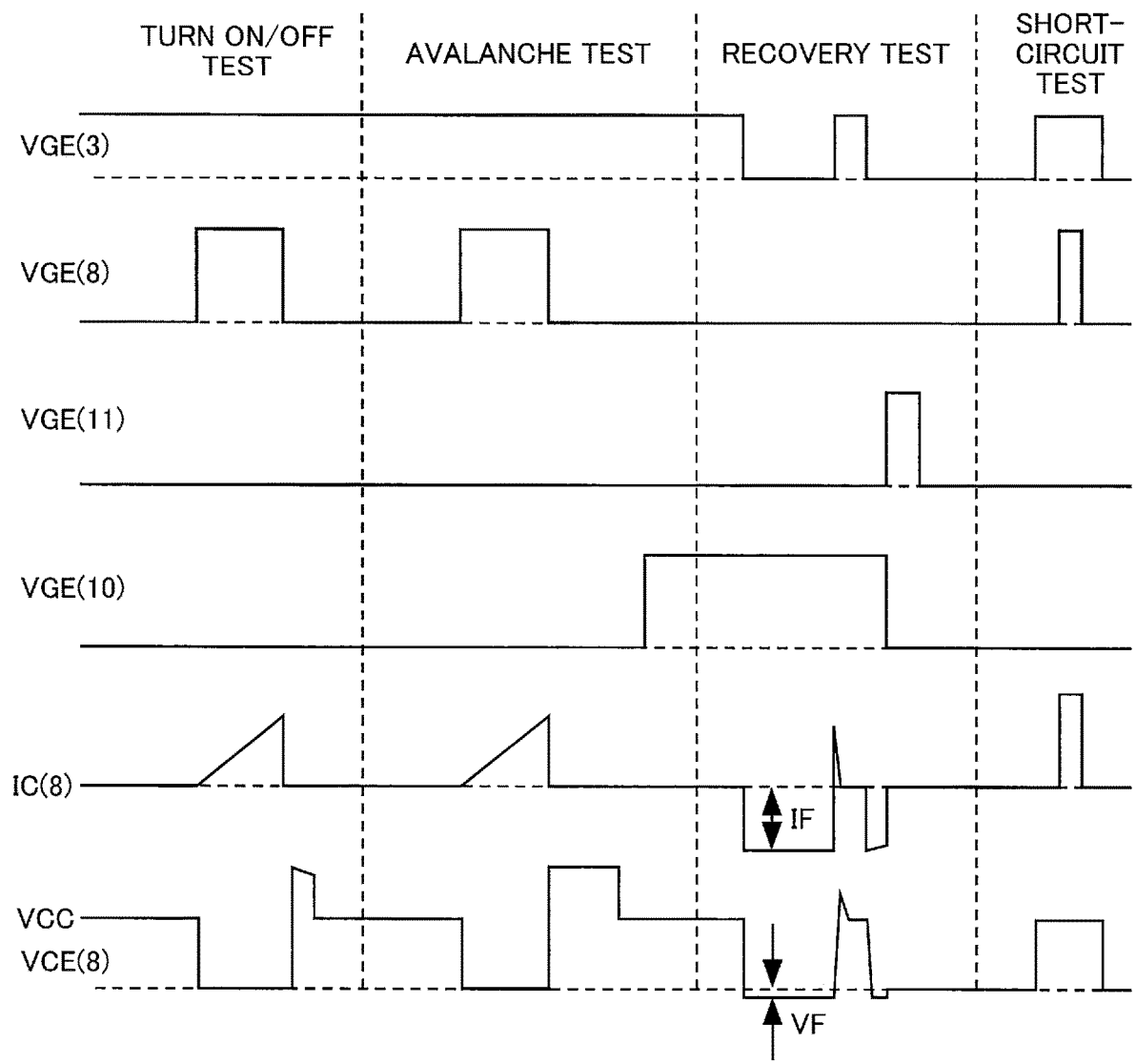
FIG. 4 illustrates waveforms indicative of the operating state of the semiconductor test circuit.

FIG. 3 illustrates the operating state of each relay. FIG. 4 illustrates waveforms indicative of the operating state of the semiconductor test circuit. FIG. 4 illustrates a gate-emitter voltage VGE(3) of the switching element 3, a gate-emitter voltage VGE(8) of the RC-IGBT chip 8, a gate-emitter voltage VGE(11) of the switching element 11, a gate-emitter voltage VGE(10) of the switching element 10, a collector current IC(8) of the RC-IGBT chip 8, and a collector-emitter voltage VCE(8) of the RC-IGBT chip 8 from the top.

With a turn on/off test of the IGBT portion 8a of the RC-IGBT chip 8, the relays RL1, RL3, RL5, and RL6 are turned off and the relays RL2 and RL4 are turned on. As a result, a circuit made up of the coil L1 and the diode D1 connected in parallel is connected in series with the RC-IGBT chip 8 as a load of the RC-IGBT chip 8 and the snubber circuit 4 is connected in parallel with the RC-IGBT chip 8.

The switching element 3 is kept on during the turn on/off test. When a gate signal of the RC-IGBT chip 8 is at a low (L) level, the IGBT portion 8a is off. Accordingly, the collector current IC(8) is 0 and the collector-emitter voltage VCE(8) is equal to the voltage VCC of the power supply 1.

When the gate signal of the RC-IGBT chip 8 becomes a high (H) level, the IGBT portion 8a turns on. As a result, the collector current IC(8) begins to flow via the coil L1 and the collector-emitter voltage VCE(8) becomes 0.

Next, when the gate signal of the RC-IGBT chip 8 becomes the low (L) level, the IGBT portion 8a turns off. At this time, an increase in the collector current IC(8) is stopped and the collector current IC(8) becomes 0. The collector-emitter voltage VCE(8) rises sharply far above the voltage VCC of the power supply 1 because of back electromotive force of the coil L1. The back electromotive force is shortly absorbed by the diode D1. As a result, the collector-emitter voltage VCE(8) becomes the voltage VCC of the power supply 1.

In the turn on/off test, a change in the collector current IC(8) of the IGBT portion 8a is observed by the use of the ammeter 6 and a change in the collector-emitter voltage VCE(8) of the IGBT portion 8a is observed by the use of the voltmeter 7.

On/off conditions of an avalanche test differ from the on/off conditions of the turn on/off test only in that the relay RL4 is turned off. With the avalanche test the diode D1 which absorbs back electromotive force of the coil L1 is not used. As a result, after the IGBT portion 8a turns off, the back electromotive force is consumed by the RC-IGBT chip 8. Accordingly, after the IGBT portion 8a turns off, a state in which the collector-emitter voltage VCE(8) of the IGBT portion 8a is high continues for a while.

With a recovery test, the relays RL2 and RL4 are turned off and the relays RL1, RL3, RL5, and RL6 are turned on. As a result, the capacitor 9 is connected in parallel with a circuit made up of the RC-IGBT chip 8 and the switching element 3 connected in series, and the FWD characteristic test load 5 is connected in parallel with the RC-IGBT chip 8.

In the recovery test, the IGBT portion 8a is kept off and the switching element 3 is turned on and off. By doing so, the recovery characteristic of the FWD portion 8b is tested.

First, when the switching elements 3 and 10 are turned on, the FWD portion 8b is reverse-biased. Therefore, the collector current IC(8) of the RC-IGBT chip 8, that is to say, a current of the FWD portion 8b becomes 0. Furthermore, the collector-emitter voltage VCE(8) of the RC-IGBT chip 8, that is to say, a voltage across terminals of the FWD portion 8b becomes the voltage VCC of the power supply 1. At this time a current from the power supply 1 flows along a path from the switching element 3, through the relay RL3, the coil L2, the switching element 10, and the relay RL6, to the power supply 1.

Next, when the switching element 3 is turned off, a loop for releasing energy stored in the coil L2 is formed by the coil L2, the switching element 10, the relay RL6, the FWD portion 8b, the ammeter 6, and the relay RL3. At this time a reflux current from the coil L2 flows through the FWD portion 8b. Therefore, a current of the FWD portion 8b becomes a regular forward current IF and a voltage across the terminals of the FWD portion 8b becomes a forward voltage VF.

Next, when the switching element 3 is turned on again, a regular short-circuit current given by −di/dt flows from the capacitor 9 disposed very near to the RC-IGBT chip 8 and charged by the power supply 1 via the switching element 3 to the FWD portion 8b. The reflux current flowing through the FWD portion 8b is canceled by this short-circuit current and the FWD portion 8b enters a reverse recovery period. At this time a regular reverse recovery current given by −di/dt flows through the FWD portion 8b and a reverse recovery voltage is applied. The recovery characteristic of the FWD portion 8b is determined from the observed reverse recovery current and reverse recovery voltage. After that, the current flowing via the switching element 3 flows along a path from the relay RL3, through the coil L2, the switching element 10, and the relay RL6, to the power supply 1. Therefore, a current of the FWD portion 8b becomes 0 and a voltage across the terminals of the FWD portion 8b becomes the voltage VCC of the power supply 1.

Next, when the switching element 3 is turned off again, a reflux current from the coil L2 flows again through the FWD portion 8*b*. Therefore, a current of the FWD portion 8*b* becomes the regular forward current IF and a voltage across the terminals of the FWD portion 8*b* becomes the forward voltage VF.

Next, when the switching element 10 is turned off and the switching element 11 is turned on, the reflux current flowing through the FWD portion 8*b* is commutated to the commutation circuit 5*a*. Therefore, the flow of the reflux current through the FWD portion 8*b* is stopped immediately and a voltage across the terminals of the FWD portion 8*b* becomes 0. This makes it possible to proceed to the next test without waiting for a long time until the reflux current flowing through the FWD portion 8*b* becomes 0.

With a short-circuit test of the IGBT portion 8*a*, only the relay RL1 is turned on and the other relays RL2, RL3, RL4, RL5, and RL6 are turned off. As a result, a circuit made up of the switching element 3 and the RC-IGBT chip 8 connected in series is connected in series with the power supply 1.

In the short-circuit test, the switching element 3 is kept on and the IGBT portion 8*a* of the RC-IGBT chip 8 is made on only for a short period of time. As a result, the collector current IC(8) of the RC-IGBT chip 8 becomes a short-circuit current and the collector-emitter voltage VCE(8) becomes approximately VCC. The short-circuit test of the RC-IGBT chip 8 is performed by observing these current and voltage.

Quality determination of the RC-IGBT chip 8 is made in each test performed by the use of the above semiconductor test circuit. If the determination that the RC-IGBT chip 8 fails in any test is made, then the RC-IGBT chip 8 is discarded at that phase without performing the remaining tests.

Figure 5:
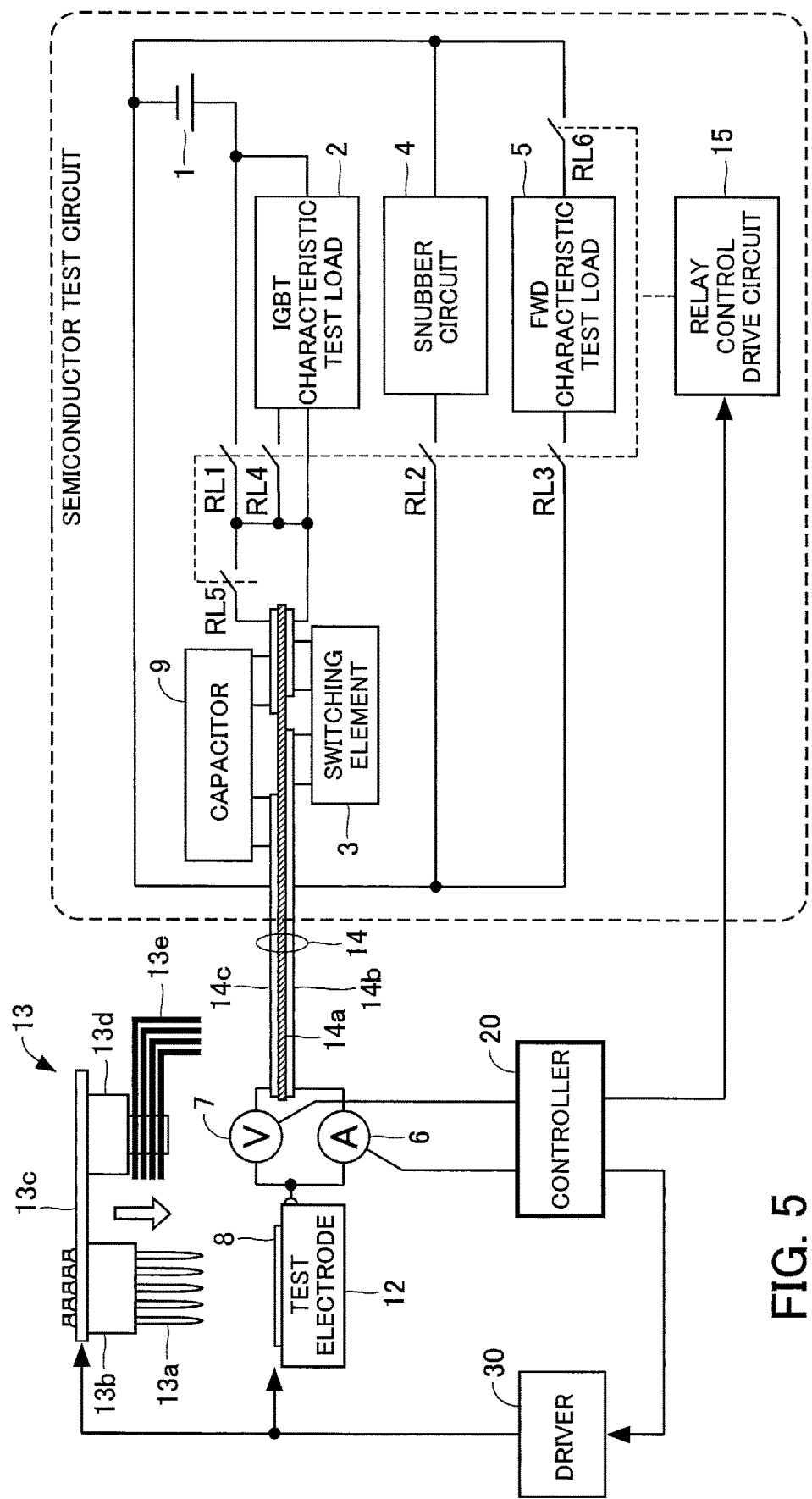
FIG. 5 illustrates the structure of an important part of a semiconductor test apparatus.

FIG. 5 illustrates the structure of an important part of a semiconductor test apparatus.

A semiconductor test apparatus includes a test electrode 12 on which the RC-IGBT chip 8 to be tested is mounted, a contact portion 13, and a parallel plate substrate 14 in addition to the above semiconductor test circuit.

The RC-IGBT chip 8 is placed on the test electrode 12. As a result, the collector electrode of the IGBT portion 8*a* of the RC-IGBT chip 8 and the cathode electrode of the FWD portion 8*b* of the RC-IGBT chip 8 are brought into electrical contact with each other.

The contact portion 13 includes contact probes 13*a*, a contact block 13*b*, a conductive member 13*c*, a support member 13*d*, and a contact member 13*e*. The contact probes 13*a* are brought into electrical contact with the emitter electrode of the IGBT portion 8*a* of the RC-IGBT chip 8, the anode electrode of the FWD portion 8*b* of the RC-IGBT chip 8, and the gate electrode of the IGBT portion 8*a*. The number of the contact probes 13*a* brought into electrical contact with the emitter electrode of the IGBT portion 8*a* and the anode electrode of the FWD portion 8*b* correspond to a current-carrying capacity. The contact block 13*b* supports the contact probes 13*a*. The contact member 13*e* has a plurality of needle-shaped conductive members and is supported by the support member 13*d*. The contact block 13*b* and the support member 13*d* are supported by the conductive member 13*c* and are electrically connected to each other. The contact portion 13 includes an elevating mechanism and is raised or lowered at the time of replacing or testing the RC-IGBT chip 8. The emitter electrode and the gate electrode of the IGBT portion 8*a* are electrically connected to the parallel plate substrate 14 at the time of testing the RC-IGBT chip 8. The emitter electrode of the IGBT portion 8*a* of the RC-IGBT chip 8 and the anode electrode of the FWD portion 8*b* of the RC-IGBT chip 8 may be integrated or be separated from each other.

Conductive plates 14*b* and 14*c* are stuck on both surfaces of an insulating board 14*a* of the parallel plate substrate 14. With the parallel plate substrate 14 the conductive plates 14*b* and 14*c* in which currents flow in opposite directions are disposed in parallel. This reduces the self-inductance and mutual inductance of wirings.

The negative electrode terminal of the power supply 1 is connected to the conductive plate 14*c* on the upper surface side of the parallel plate substrate 14 and the capacitor 9 is mounted on the conductive plate 14*c*. Furthermore, the conductive plate 14*c* is connected to the test electrode 12 via the voltmeter 7. The switching element 3 is mounted on the conductive plate 14*b* on the lower surface side of the parallel plate substrate 14 and is connected to the test electrode 12 via the ammeter 6.

In the semiconductor test circuit, the positive electrode terminal of the power supply 1 is connected to the one terminal of the capacitor 9 via the relays RL1 and RL5. A connection point of the relays RL1 and RL5 is connected to the collector of the switching element 3 and is connected to the IGBT characteristic test load 2 via the relay RL4. The relay RL2 is disposed between the conductive plate 14*b* on the lower surface side of the parallel plate substrate 14 and the snubber circuit 4. The relay RL3 is disposed between the conductive plate 14*b* on the lower surface side of the parallel plate substrate 14 and the FWD characteristic test load 5. The relay RL6 is disposed between the FWD characteristic test load 5 and the negative electrode terminal of the power supply 1. The relays RL1 through RL6 is on-off controlled by a relay control drive circuit 15.

The relay control drive circuit 15 switches the relays RL1 through RL6 according to the test items. By doing so, all the tests are performed in a state in which the contact probes 13*a* and the contact member 13*e* are connected to the RC-IGBT chip 8 and the parallel plate substrate 14. This minimizes damage to the electrode of the RC-IGBT chip 8 caused by contact of the contact probes 13*a* with the electrode.

The ammeter 6 and the voltmeter 7 are connected to a controller 20 and measurement results obtained by the ammeter 6 and the voltmeter 7 are inputted to the controller 20. The controller 20 is connected to a driver 30. The driver 30 drives a mechanism which loads the RC-IGBT chip 8 onto or unloads the RC-IGBT chip 8 from the semiconductor test apparatus, and drives the elevating mechanism of the contact portion 13. Furthermore, the controller 20 is connected to the relay control drive circuit 15 of the semiconductor test circuit and informs the relay control drive circuit 15 of the test order of the test items set in advance. The relay control drive circuit 15 controls the relays RL1 through RL6 so that they will be in on or off states corresponding to the test order of the test items of which the controller 20 informs the relay control drive circuit 15. The order of the four tests is freely set. An example of setting test order will be described later.

Figure 6:
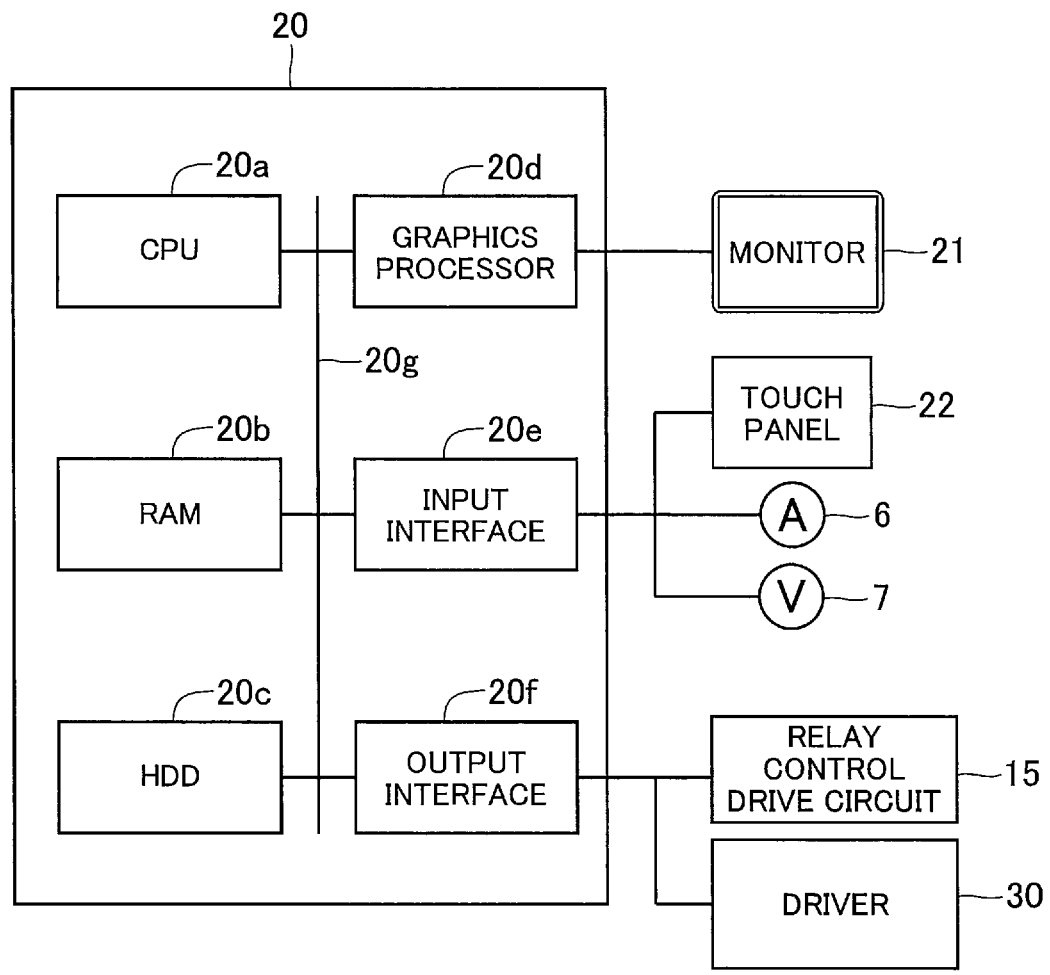
FIG. 6 is a block diagram illustrative of an example of the configuration of hardware of a controller.

FIG. 6 is a block diagram illustrative of an example of the configuration of hardware of the controller.

The controller 20 controls the whole of the semiconductor test apparatus by a central processing unit (CPU) 20*a*. A random access memory (RAM) 20*b* and a plurality of peripheral devices are connected to the CPU 20*a* via a bus 20*g*. That is to say, the controller 20 is a computer having the CPU 20*a* and the RAM 20*b*.

The RAM 20*b* is used as main storage of the controller 20. The RAM 20*b* temporarily stores at least part of an operating system (OS) program or an application program executed by the CPU 20a. In addition, the RAM 20b stores various pieces of data which the CPU 20a needs to perform a process.

The plurality of peripheral devices connected to the bus 20g are a hard disk drive (HDD) 20c, a graphics processor 20d, an input interface 20e, and an output interface 20f.

The HDD 20c is used as secondary storage of the controller 20. The HDD 20c stores the OS program, application programs executed for performing a non-defective/defective product determination process, sequence processing by the semiconductor test apparatus, and the like, and various pieces of data such as a test result data table in which non-defective/defective product determination results are accumulated and an order setting table. A semiconductor memory, such as a flash memory, may be used as secondary storage.

A monitor 21 is connected to the graphics processor 20d. The graphics processor 20d displays an image on a screen of the monitor 21 in accordance with an instruction from the CPU 20a. The monitor 21 is a liquid crystal display or the like.

A touch panel 22, the ammeter 6, and the voltmeter 7 are connected to the input interface 20e. The input interface 20e transmits to the CPU 20a an instruction input signal transmitted from the touch panel 22. In addition, the input interface 20e converts a measurement result obtained by the ammeter 6 or the voltmeter 7 to a digital signal and transmits it to the CPU 20a.

The output interface 20f is connected to the relay control drive circuit 15 of the semiconductor test circuit and the driver 30. The output interface 20f transmits an instruction from the CPU 20a to the relay control drive circuit 15 and the driver 30. The relay control drive circuit 15 on-off controls the relays RL1 through RL6 in accordance with an instruction from the CPU 20a. The driver 30 controls load or unload of the RC-IGBT chip 8 in accordance with an instruction from the CPU 20a and controls the rise or fall operation of the contact portion 13 in accordance with an instruction from the CPU 20a.

By adopting the above hardware configuration, the processing functions in the second embodiment are realized.

Figure 7:
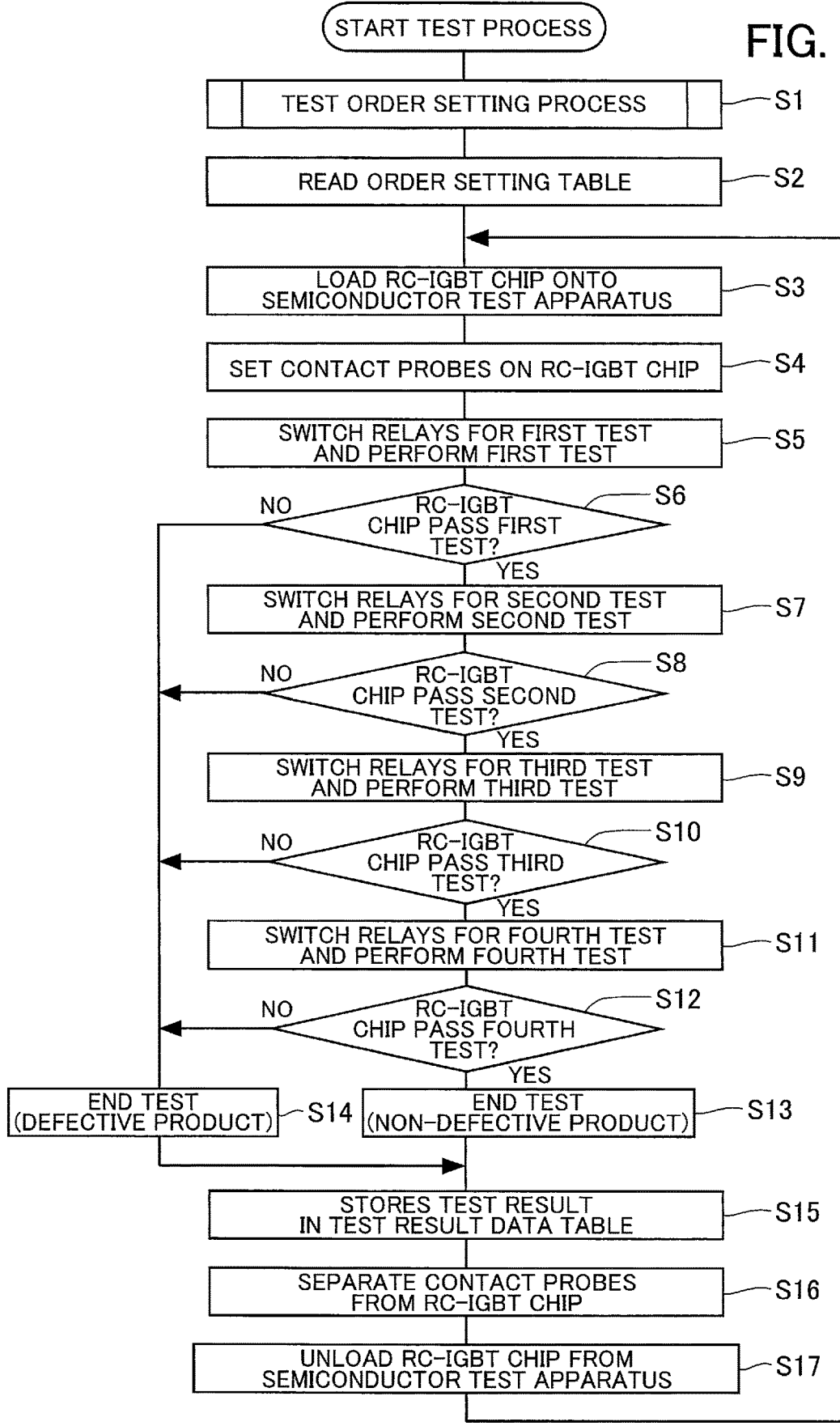
FIG. 7 is a flow chart illustrative of the flow of a test process by the controller.
Figure 8:
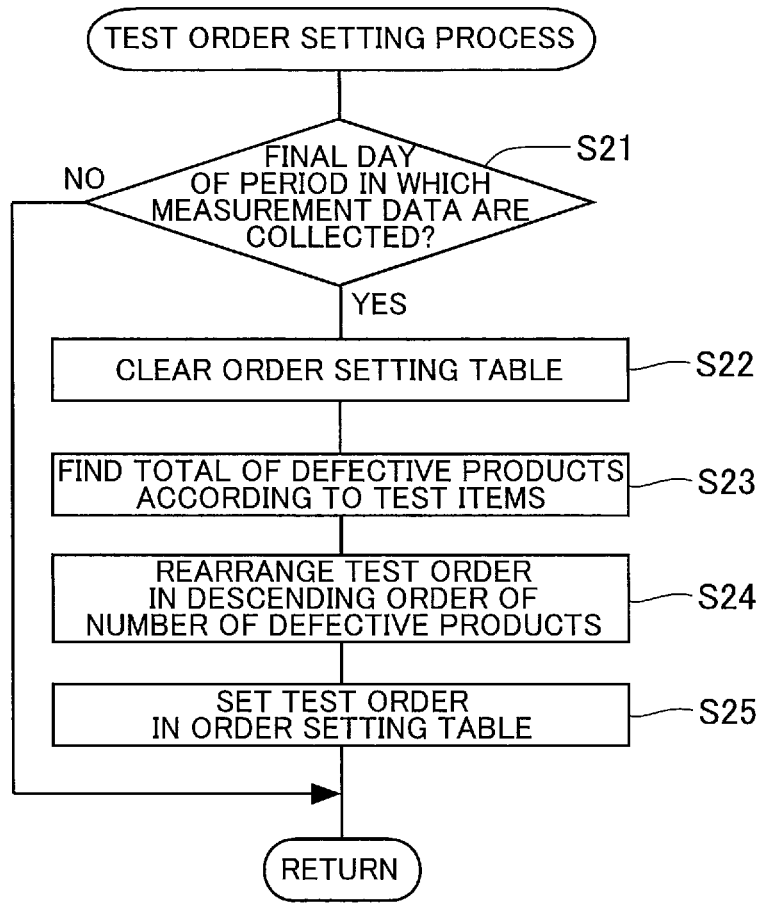
FIG. 8 is a flow chart illustrative of the flow of a test order setting process.
Figures 9A, 9B:
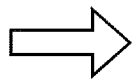
FIGS. 9A and 9B illustrate examples of data, FIG. 9A illustrating a test result data table, FIG. 9B illustrating an order setting table.

FIG. 7 is a flow chart illustrative of the flow of a test process by the controller. FIG. 8 is a flow chart illustrative of the flow of a test order setting process. FIGS. 9A and 9B illustrate examples of data. FIG. 9A illustrates a test result data table. FIG. 9B illustrates an order setting table.

As illustrated in FIG. 7, when the controller 20 is started, first the CPU 20a performs a test order setting process (step S1). As illustrated in FIG. 8, in the test order setting process the CPU 20a determines whether or not the day on which the controller 20 is started is the final day of a period in which measurement data obtained by the ammeter 6 and the voltmeter 7 are collected (step S21). If the day on which the controller 20 is started is the final day of a period set in advance, then the CPU 20a sets test order on the basis of accumulated data. For example, if a period set in advance is a week, then the above final day is the final day of the week. If a period set in advance is a month, then the above final day is the final day of the month.

That is to say, the CPU 20a clears an order setting table illustrated in FIG. 9B (step S22) and finds the total of defective products in a test result data table illustrated in FIG. 9A according to the test items (step S23). Test results are recorded in the test result data table according to the test items. If a product passes a test item, then "P" indicative of PASS is set in a field of the test result data table of FIG. 9A corresponding to the product and the test item. If a product fails to stand a test item, then "F" indicative of FAIL is set in a field of the test result data table of FIG. 9A corresponding to the product and the test item. The total of defective products is found by counting the number of F's in the test result data table according to the test items. There is a test item for which "P" or "F" is not set. This means that a test is not performed for the test item. The reason for this is that if a product fails to stand a test item, the remaining tests are not performed and the RC-IGBT chip 8 is discarded.

Next, the CPU 20a rearranges the test order in descending order of the number of defective products (step S24). Finally, the CPU 20a sets test order after the rearrangement in the order setting table (step S25).

If in step S21, the day on which the controller 20 is started is not the final day of the period set in advance, then test result data are under collection. Accordingly, the CPU 20a ends the test order setting process without performing any step.

With the test order setting process illustrated in FIG. 8, the collection of test result data is limited by the number of days. However, the collection of test result data may be limited by one test item or the number of RC-IGBT chips 8 on which a test is performed. In this case, the CPU 20a determines in step S21 whether or not the number of pieces of data accumulated is greater than or equal to a number set in advance. Furthermore, clearing an order setting table in step S22 may be performed not at this point of time but just before step S25 in which test order after the rearrangement is set in the order setting table.

To return to FIG. 7, when the test order setting process ends, the CPU 20a reads the order setting table (step S2). Next, the CPU 20a gives the driver 30 instructions to load the RC-IGBT chip 8 onto the semiconductor test apparatus (step S3) and instructions to set the contact probes 13a of the contact portion 13 on the RC-IGBT chip 8 (step S4).

Next, the CPU 20a gives the relay control drive circuit 15 of the semiconductor test circuit instructions to switch the relays RL1 through RL6 for a first test and gives the switching control circuit (not illustrated) instructions to on-off control the switching elements 3, 10, and 11. By doing so, the CPU 20a performs the first test (step S5).

Next, the CPU 20a determines whether or not the RC-IGBT chip 8 passes the first test (step S6). If the RC-IGBT chip 8 passes the first test, then the CPU 20a gives the relay control drive circuit 15 of the semiconductor test circuit instructions to switch the relays RL1 through RL6 for a second test and gives the switching control circuit (not illustrated) instructions to on-off control the switching elements 3, 10, and 11. By doing so, the CPU 20a performs the second test (step S7).

Next, the CPU 20a determines whether or not the RC-IGBT chip 8 passes the second test (step S8). If the RC-IGBT chip 8 passes the second test, then the CPU 20a gives the relay control drive circuit 15 of the semiconductor test circuit instructions to switch the relays RL1 through RL6 for a third test and gives the switching control circuit (not illustrated) instructions to on-off control the switching elements 3, 10, and 11. By doing so, the CPU 20a performs the third test (step S9).

Next, the CPU 20a determines whether or not the RC-IGBT chip 8 passes the third test (step S10). If the RC-IGBT chip 8 passes the third test, then the CPU 20a gives the relay control drive circuit 15 of the semiconductor test circuit instructions to switch the relays RL1 through RL6 for a fourth test and gives the switching control circuit (not illustrated) instructions to on-off control the switching elements 3, 10, and 11. By doing so, the CPU 20a performs the fourth test (step S11).

Next, the CPU 20a determines whether or not the RC-IGBT chip 8 passes the fourth test (step S12). If the RC-IGBT chip 8 passes the fourth test, then the CPU 20a considers the RC-IGBT chip 8 on which the tests are performed as a non-defective product and ends a test on the RC-IGBT chip 8 (step S13).

If the RC-IGBT chip 8 does not pass the test in each of steps S6, S8, S10, and S12, then the CPU 20a considers the RC-IGBT chip 8 on which the test is performed as a defective product and ends a test on the RC-IGBT chip 8 (step S14).

Next, the CPU 20a stores a test result obtained in step S13 or S14 in the test result data table (step S15). After that, the CPU 20a gives the driver 30 instructions to separate the contact probes 13a from the RC-IGBT chip 8 (step S16) and instructions to unload the RC-IGBT chip 8 from the semiconductor test apparatus (step S17) and returns to step S3.

As has been described, the tests are performed in the order set in the order setting table. If an RC-IGBT chip 8 does not pass a test item, then a test is ended at that point of time. As a result, there is no need to perform an unnecessary test. This reduces test time. In other words, the number of RC-IGBT chips 8 tested in the same test time is increased. In addition, test results are stored according to the test items and the test items are performed in descending order of the probability that an RC-IGBT chip 8 will become a defective product. This increases the probability that a defective product will be found early in test order. As a result, the probability that an unnecessary test will be performed is lowered and test time is reduced further.

In the second embodiment, the relays RL3 and RL6 are used for completely separating the FWD characteristic test load 5 from the RC-IGBT chip 8. However, one of the relays RL3 and RL6 may be omitted. For example, the relay RL6 may be omitted.

Figure 10:
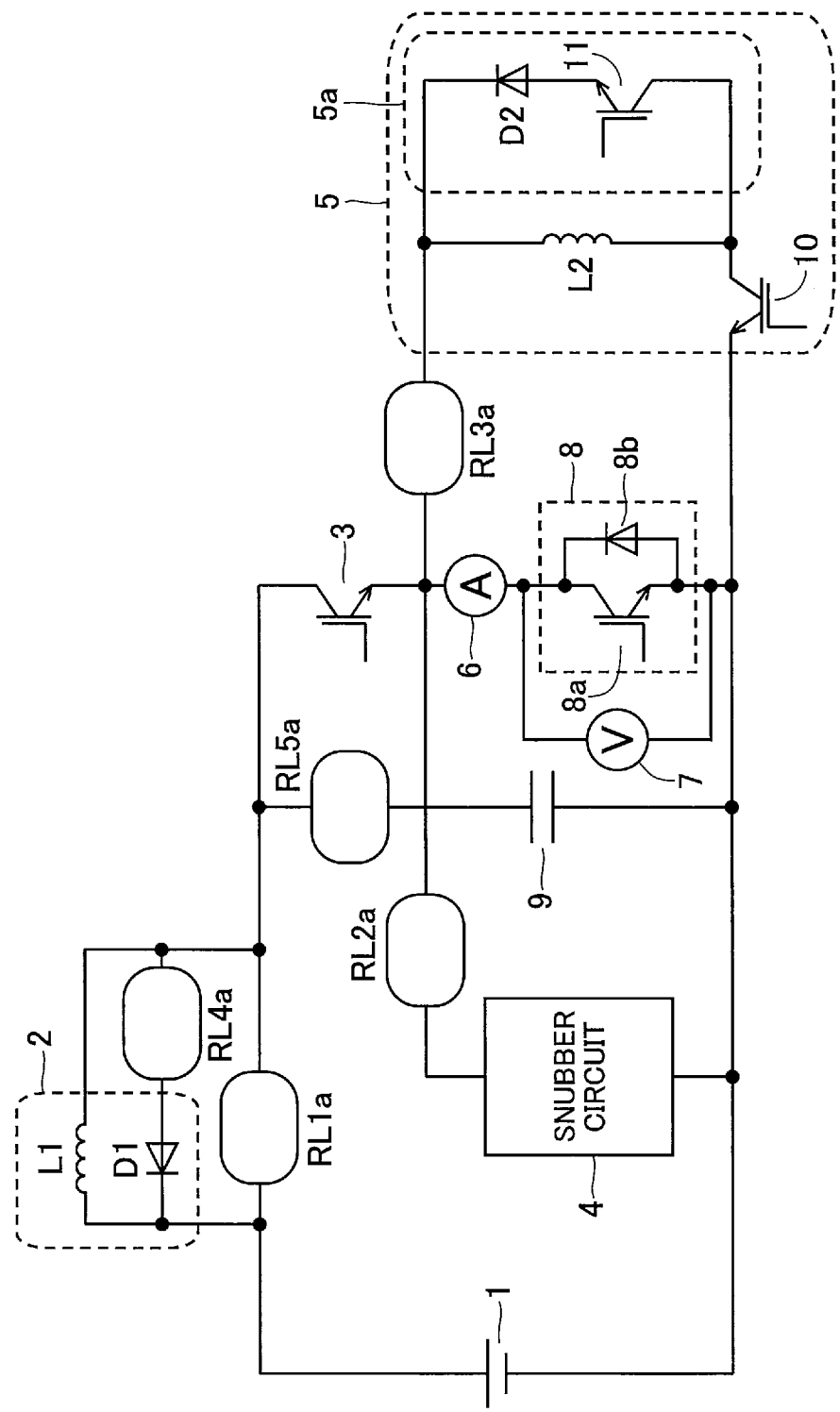
FIG. 10 is a circuit diagram illustrative of an example of a semiconductor test circuit according to a third embodiment.

FIG. 10 is a circuit diagram illustrative of an example of a semiconductor test circuit according to a third embodiment. Components in FIG. 10 which are the same as those illustrated in FIG. 2 are marked with the same numerals and detailed descriptions of them will be omitted according to circumstances.

With a semiconductor test circuit according to a third embodiment, the relays RL1 through RL6 used in the second embodiment are replaced with switching elements. However, the relay RL6 connected in series with the switching element 10 of the FWD characteristic test load 5 has the same function as the switching element 10 has. Therefore, a relay RL6 is omitted in the third embodiment. Each switching element may be an IGBT, a MOSFET, a solid state relay utilizing the on-off operation of a semiconductor switching element, an electromagnetic contactor, or an electromagnetic switch.

In the third embodiment, RL1a through RL5a obtained by adding the suffix "a" to the numerals RL1 through RL5, respectively, are used as numerals indicative of the switching elements corresponding to the relays RL1 through RL5 in order to clarify the correspondence between the relays RL1 through RL5 and the switching elements.

IGBTs are used as the switching elements RL1a through RL4a through which a current flows in one direction, and a solid state relay is used as the switching element RL5a through which a current flows in both directions. However, there is no special limitation. It is a matter of course that solid state relays may be used as part of the switching elements RL1a through RL4a.

In the semiconductor test circuit having the above structure, an operating state in which the switching elements RL1a through RL5a are turned on or off according to test items is equal to the operating states of the relays RL1 through RL5 illustrated in FIG. 3. That is to say, when a turn on/off test is performed on the IGBT portion 8a of the RC-IGBT chip 8, the switching elements RL2a and RL4a are turned on and the switching elements RL1a, RL3a, and RL5a are turned off. When an avalanche test is performed on the IGBT portion 8a, the switching element RL2a is turned on and the switching elements RL1a, RL3a, RL4a, and RL5a are turned off. When a recovery test is performed on the FWD portion 8b, the switching elements RL1a, RL3a, and RL5a are turned on and the switching elements RL2a and RL4a are turned off. When a short-circuit test is performed on the IGBT portion 8a, the switching element RL1a is turned on and the switching elements RL2a, RL3a, RL4a, and RL5a are turned off.

When each test is performed, the switching elements RL1a through RL5a are put into the above on or off states and the switching element 3, the RC-IGBT chip 8, and the switching elements 10 and 11 are turned on or off at timings illustrated in FIG. 4.

Figure 11:
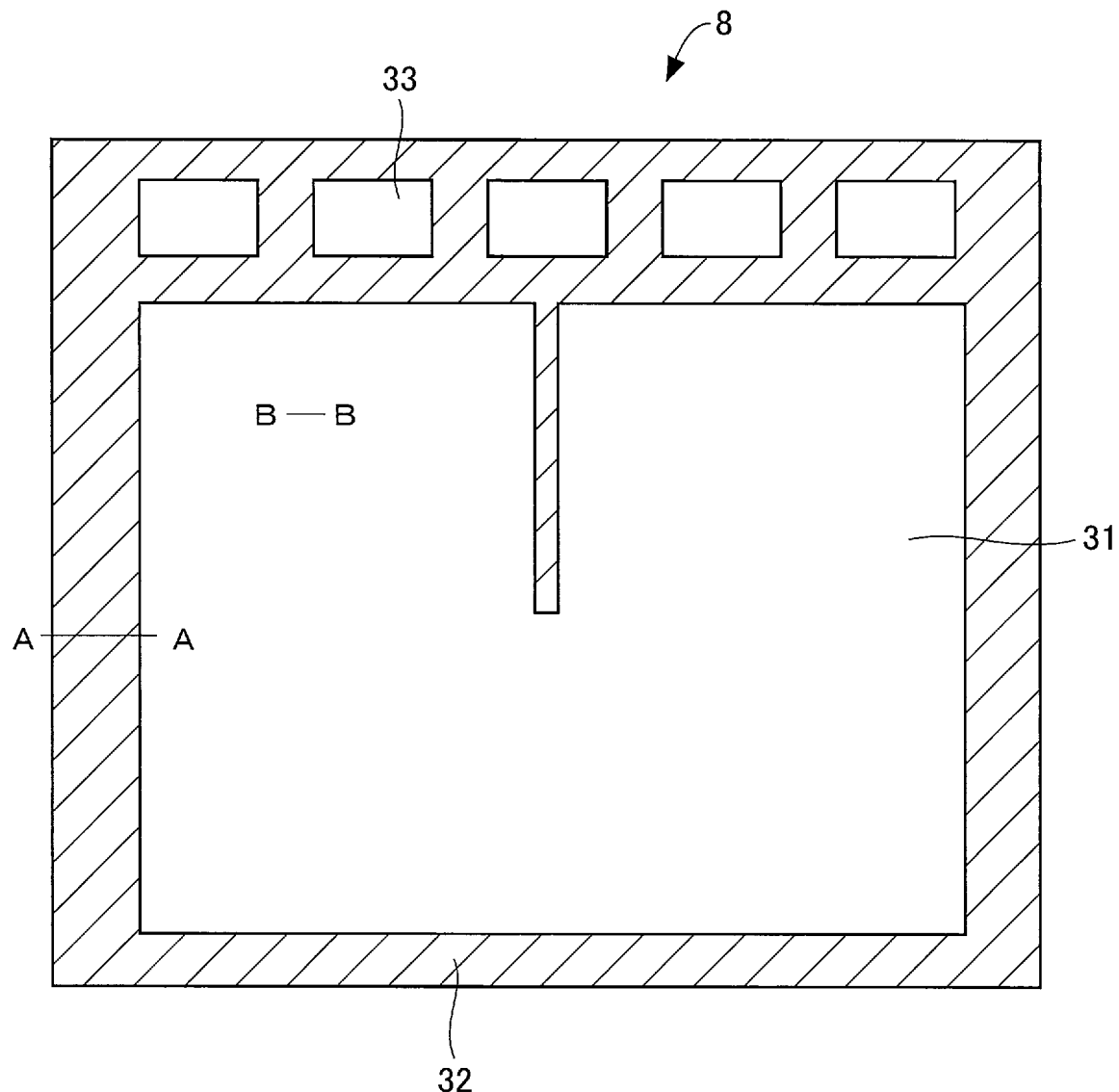
FIG. 11 is a plan view of an RC-IGBT chip.
Figure 12:
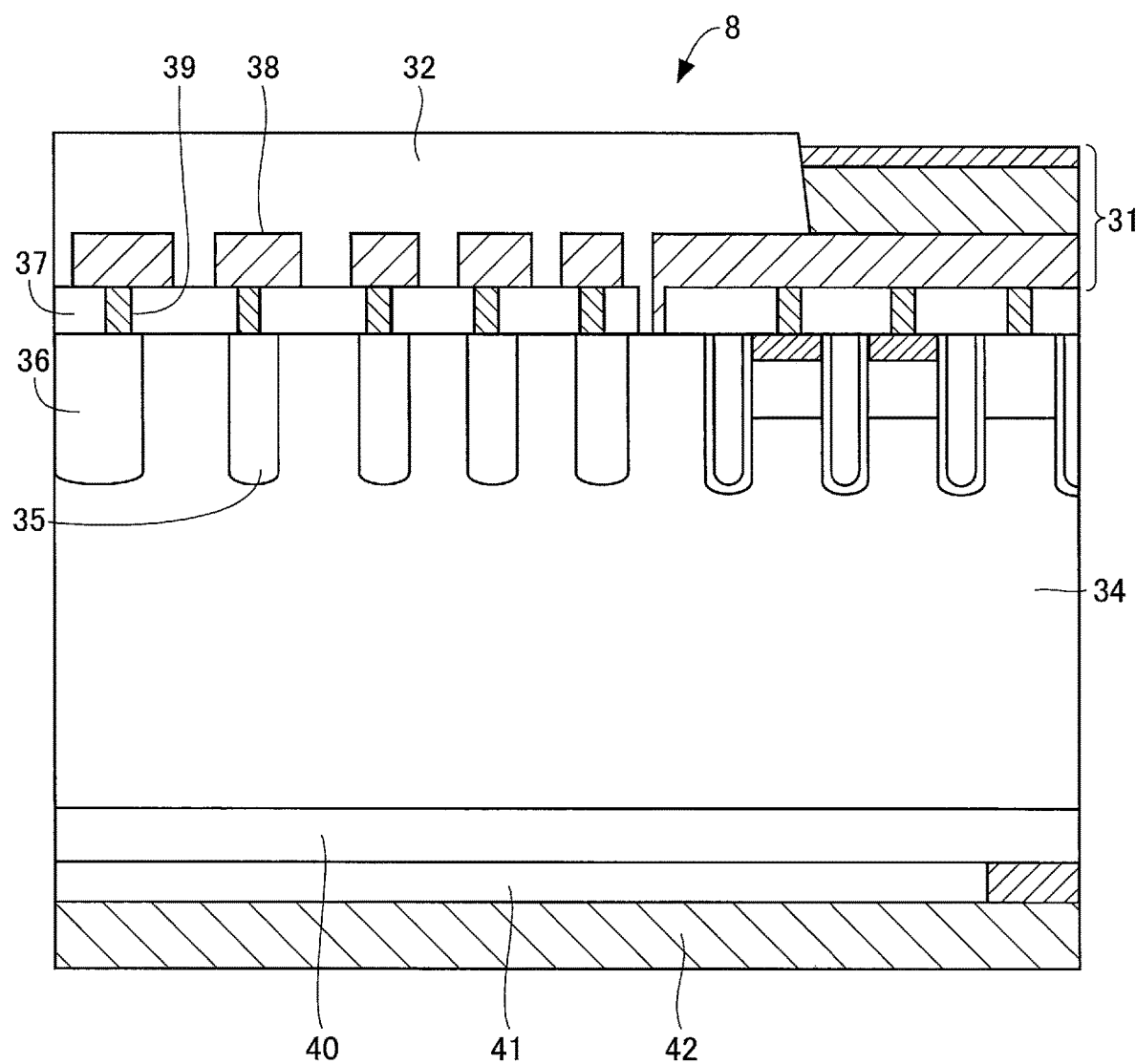
FIG. 12 is a sectional view taken along the line A-A of FIG. 11.
Figure 13:
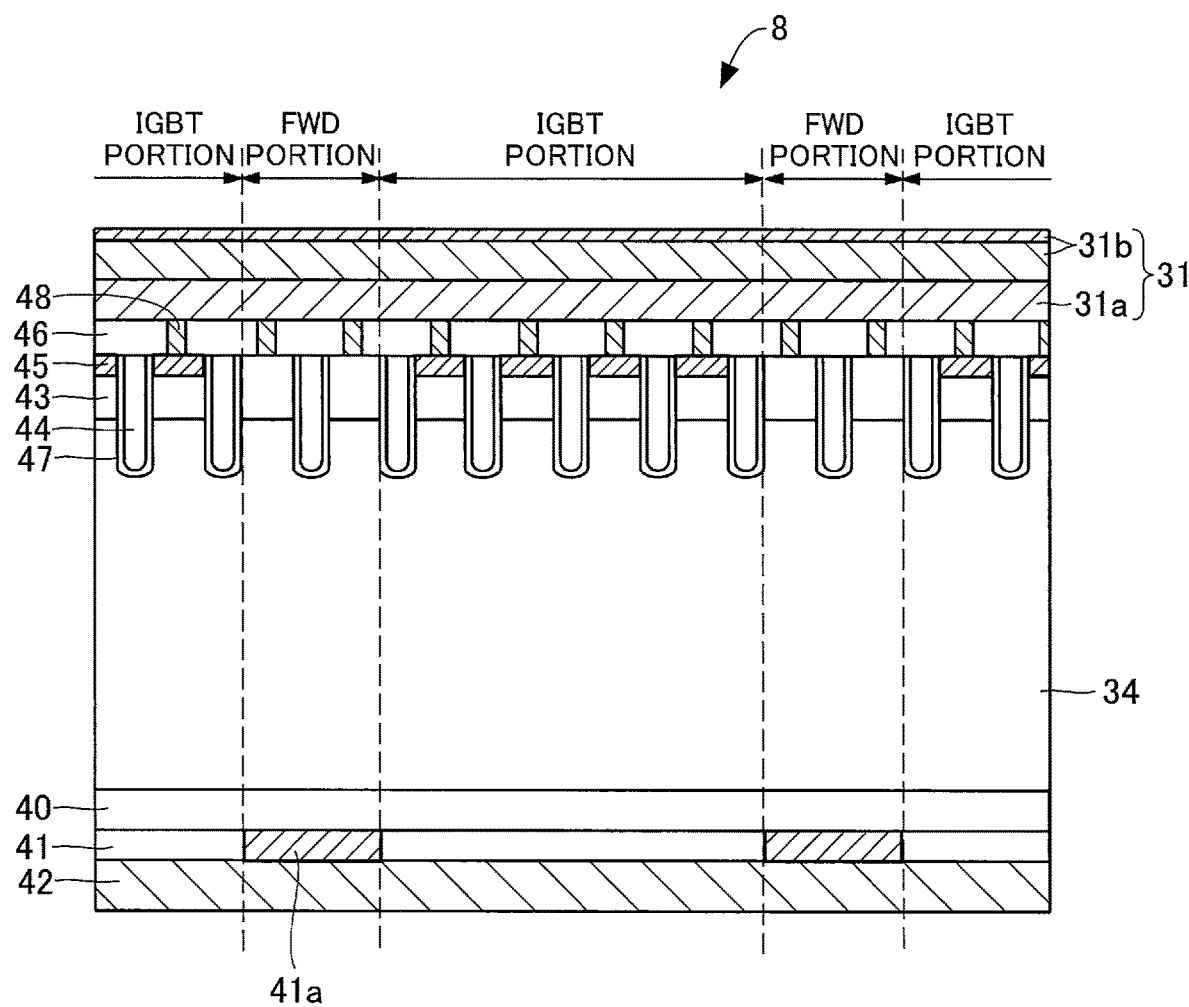
FIG. 13 is a sectional view taken along the line B-B of FIG. 11.

FIG. 11 is a plan view of the RC-IGBT chip. FIG. 12 is a sectional view taken along the line A-A of FIG. 11. FIG. 13 is a sectional view taken along the line B-B of FIG. 11.

As illustrated in FIG. 11, the RC-IGBT chip includes a surface electrode 31, a passivation film 32 formed so as to protect the outer periphery of the surface electrode 31, and a plurality of gate electrodes 33. The surface electrode 31 corresponds to the emitter of the IGBT portion 8a and the anode of the FWD portion 8b. At test time the contact probes 13a of the contact portion 13 are brought into contact with the surface electrode 31 and the gate electrodes 33.

As illustrated in FIG. 12, a section under the passivation film 32 has the following structure. A plurality of guard rings 35 are formed in a surface layer portion of a drift layer 34 so as to surround a region in which the IGBT portion 8a and the FWD portion 8b are formed, and a stopper region 36 is formed in an outermost peripheral portion of the drift layer 34. An insulating film 37 is formed over the guard rings 35 and the stopper region 36. Furthermore, outer peripheral electrodes 38 are formed at positions over the insulating film 37 corresponding to the guard rings 35 and the stopper region 36. The guard rings 35 and the stopper region 36 are electrically connected to the outer peripheral electrodes 38 via plug electrodes 39. The outer peripheral electrodes 38 are covered with and protected by the passivation film 32.

A field stop layer 40 is formed under the drift layer 34 and a collector 41 is formed under the field stop layer 40. Furthermore, the collector 41 is covered with a back electrode 42. The back electrode 42 is formed by the use of a material having aluminum for its main ingredient. The outer surface of the back electrode 42 may be covered with a plated layer (not illustrated). In addition, when the RC-IGBT chip 8 is loaded onto the semiconductor test apparatus at test time, the back electrode 42 is brought into contact with the test electrode 12.

As illustrated in FIG. 13, a section under the surface electrode 31 has a structure in which an IGBT portion 8a and an FWD portion 8b are formed alternately and closely. That is to say, a base region 43 is formed in the surface layer portion of the drift layer 34 and a plurality of trenches 44 are formed so as to pierce the base region 43 and reach the drift layer 34.

In the IGBT portion 8a, an emitter region 45 is formed in a surface layer portion of the base region 43 surrounded by the trenches 44. In the FWD portion 8b, on the other hand, nothing is formed in a surface layer portion of the base region 43.

An insulating film 46 is formed over the base region 43, the trenches 44, and the emitter region 45. The surface electrode 31 is formed over the insulating film 46. The surface electrode 31 includes an electrode 31a formed over the insulating film 46 by the use of a material having aluminum for its main ingredient and a two-layer plated electrode 31b which covers the electrode 31a. The plated electrode 31b of the surface electrode 31 is not indispensable and is not formed in some cases.

In the IGBT portion 8a, a gate electrode 47 in the trench 44 is electrically connected to the gate electrode 33 formed in the surface of the RC-IGBT chip 8. Furthermore, the emitter region 45 is electrically connected to the electrode 31a of the surface electrode 31 via a plug electrode 48 formed so as to pierce the insulating film 46.

In the FWD portion 8b, the base region 43 functions as an anode and is electrically connected to the electrode 31a of the surface electrode 31 via the plug electrode 48. In addition, in the FWD portion 8b, the collector 41 adjacent to the back electrode 42 functions as a cathode 41a.

The suitable embodiments have been described. However, the present disclosure is not limited to these specific embodiments. In the above embodiment, for example, an IGBT or a solid state relay is used as a semiconductor switching element. However, another device may be used. A power MOSFET, a thyristor, a triac, a bipolar transistor, or the like may be used.

According to the semiconductor test circuit, the semiconductor test apparatus, and the semiconductor test method having the above structure, a test circuit of an IGBT portion or an FWD portion of an RC-IGBT chip is switched by relays in a state in which probes are in contact with the RC-IGBT chip. This reduces damage to an electrode caused by contact of the probes with the electrode and shortens test time.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor test circuit for performing a characteristic test of a reverse conducting-insulated gate bipolar transistor (RC-IGBT) chip onto which an IGBT portion and a freewheeling diode (FWD) portion are integrated, the semiconductor test circuit comprising:
    a power supply;
    a first switching element that is a semiconductor connected to a collector of the RC-IGBT chip;
    a first coil connected between a positive electrode terminal of the power supply and the first switching element;
    a first diode connected in parallel with the first coil and having a cathode connected to the positive electrode terminal of the power supply;
    a snubber circuit connected between the collector and an emitter of the RC-IGBT chip;
    a second coil connected between the collector and the emitter of the RC-IGBT chip;
    a first relay connected in parallel with the first coil;
    a second relay connected between the collector of the RC-IGBT chip and the snubber circuit;
    a third relay connected between the collector of the RC-IGBT chip and the second coil; and
    a fourth relay connected in series with the first diode.

2. The semiconductor test circuit according to claim 1, further comprising a circuit including a fifth relay and a capacitor connected in series, the circuit being connected to the first coil, the first switching element, and the emitter of the RC-IGBT chip.

3. The semiconductor test circuit according to claim 2, wherein the first through fifth relays are semiconductor switching elements.

4. The semiconductor test circuit according to claim 2, further comprising:
    a second switching element connected between the emitter of the RC-IGBT chip and the second coil; and
    a commutation circuit connected in parallel with the second coil.

5. The semiconductor test circuit according to claim 4, wherein the commutation circuit includes a third switching element and a second diode connected in series, the second diode having a cathode connected to the collector of the RC-IGBT chip.

6. The semiconductor test circuit according to claim 4, further comprising a sixth relay disposed between the emitter of the RC-IGBT chip and the second switching element.

7. The semiconductor test circuit according to claim 6, wherein when a recovery test is performed on the FWD portion, the fifth relay and the sixth relay are turned on.

8. The semiconductor test circuit according to claim 1, wherein:
    when a short-circuit test is performed on the IGBT portion and a recovery test is performed on the FWD portion, the first relay is turned on;
    when a turn on/off test and an avalanche test are performed on the IGBT portion, the second relay is turned on;
    when the recovery test is performed on the FWD portion, the third relay is turned on; and
    when the turn on/off test is performed on the IGBT portion, the fourth relay is turned on.

9. The semiconductor test circuit according to claim 1, further comprising
    an ammeter to detect a collector current of the IGBT portion of the RC-IGBT chip and a forward current of the FWD portion of the RC-IGBT chip, and
    a voltmeter to detect a collector-emitter voltage of the RC-IGBT chip.

10. A semiconductor test apparatus for performing a characteristic test of a reverse conducting-insulated gate bipolar transistor (RC-IGBT) chip onto which an IGBT portion and a freewheeling diode (FWD) portion are integrated, the semiconductor test apparatus comprising:
    a power supply;
    a first switching element connected to a collector of the RC-IGBT chip;
    a first coil connected between a positive electrode terminal of the power supply and the first switching element;
    a second coil;
    a first diode;
    a second diode;

a snubber circuit;
a capacitor;
a second switching element connected between an emitter of the RC-IGBT chip and the second coil;
a third switching element connected in series with the second diode and connected, together with the second diode, in parallel with the second coil;
a first relay connected in parallel with the first coil;
a second relay connected between the collector and the emitter of the RC-IGBT chip and connected in series with the snubber circuit;
a third relay connected to the collector of the RC-IGBT chip and the first switching element and the second coil;
a fourth relay connected in series with the first diode and connected, together with the first diode, in parallel with the first coil;
a fifth relay connected in series with the capacitor so as to connect the capacitor, the first coil, the first switching element, and the emitter of the RC-IGBT chip;
a relay control drive section to control switching of the first through fifth relays according to test items;
an ammeter to measure a collector current of the IGBT portion of the RC-IGBT chip and a forward current of the FWD portion of the RC-IGBT chip;
a voltmeter to measure a collector-emitter voltage of the RC-IGBT chip;
a controller to inform the relay control drive section of an order of the test items set in advance and to determine on the basis of a measurement result of the ammeter and a measurement result of the voltmeter whether the RC-IGBT chip is a non-defective or defective product; and
a driver to drive in response to instructions from the controller a mechanism that loads or unloads the RC-IGBT chip and to drive in response to instructions from the controller an elevating mechanism of a contact portion raised or lowered at the time of replacing or testing the RC-IGBT chip.

11. The semiconductor test apparatus according to claim 10, wherein the controller accumulates measurement results of the ammeter and measurement results of the voltmeter and rearranges the order of the test items in descending order of a probability that a defective product is found.

12. The semiconductor test apparatus according to claim 10, wherein when the controller determines that the RC-IGBT chip under test is a defective product, the controller stops tests for subsequent test items and gives the driver instructions to discard the RC-IGBT chip.

13. A semiconductor test method for performing a characteristic test of a reverse conducting-insulated gate bipolar transistor (RC-IGBT) chip onto which an IGBT portion and a freewheeling diode (FWD) portion are integrated, the semiconductor test method causing a computer to perform a process comprising:
accumulating measurement results of the characteristic test of the RC-IGBT chip according to test items;
rearranging an order of the test items in descending order of a probability that a defective product is found in a determined period or at the time when a determined sample number is reached;
giving a driver instructions to load the RC-IGBT chip onto a semiconductor test apparatus;
giving the driver instructions to set contact probes of a contact portion on the RC-IGBT chip;
giving a relay control drive circuit instructions to switch relays in order so as to perform the test items in the rearranged order, the relays including a relay which connects to the RC-IGBT chip an IGBT characteristic test load including a circuit made up of a first coil and a first diode connected in parallel and a snubber circuit at the time of a turn on/off test of the IGBT portion, a relay which connects to the RC-IGBT chip the IGBT characteristic test load including the first coil and the snubber circuit at the time of an avalanche test of the IGBT portion, a relay which connects to the RC-IGBT chip an FWD characteristic test load including a circuit made up of a second coil and a second diode connected in parallel and a capacitor for suppressing fluctuations in a power supply at the time of a recovery test of the FWD portion, and a relay which connects the power supply to the RC-IGBT chip at the time of a short-circuit test of the IGBT portion; and
giving the driver instructions to stop, at the time of determining that the RC-IGBT chip is a defective product for a test item being made as a result of a test performed in accordance with the order of the test items, tests for subsequent test items.

14. A semiconductor test method for performing a characteristic test of a reverse conducting-insulated gate bipolar transistor (RC-IGBT) chip onto which an IGBT portion and a freewheeling diode (FWD) portion are integrated, the semiconductor test method comprising:
bringing contact probes of a semiconductor test apparatus in contact with electrodes of the RC-IGBT chip, the electrodes including an electrode of the IGBT portion and an electrode of the FWD portion;
continuously maintaining the contact probes in contact with the electrodes while:
performing one of a test of the IGBT portion and a test of the FWD portion,
after performing the one of the test of the IGBT portion and the test of the FWD portion, switching a test circuit connected to the RC-IGBT chip, and
after switching the test circuit, performing the other of the test of the IGBT portion and the test of the FWD portion; and
after performing both the test of the IGBT portion and the test of the FWD portion, separating the contact probes from the electrodes.

15. The semiconductor test method according to claim 14, wherein:
a turn on/off test, an avalanche test, and a short-circuit test are performed as the test of the IGBT portion; and
a recovery test is performed as the test of the FWD portion.

16. The semiconductor test method according to claim 15, wherein when a defective product is found in any of the turn on/off test of the IGBT portion, the avalanche test of the IGBT portion, the recovery test of the FWD portion, and the short-circuit test of the IGBT portion, a test process is stopped at that stage and remaining tests are not performed.

17. The semiconductor test method according to claim 14, wherein when a defective product is found in any test, a test process is stopped at that stage and remaining tests are not performed.

18. The semiconductor test method according to claim 14, wherein the electrodes of the RC-IGBT chip with which the contact probes are in contact are an emitter electrode of the IGBT portion, an anode electrode of the FWD portion, and a gate electrode of the IGBT portion.

19. The semiconductor test method according to claim 18, wherein the emitter electrode of the IGBT portion and the anode electrode of the FWD portion are integrally formed.

20. A semiconductor test method for performing a characteristic test of a reverse conducting-insulated gate bipolar transistor (RC-IGBT) chip onto which an IGBT portion and a freewheeling diode (FWD) portion are integrated, the semiconductor test method comprising:
performing a test of the IGBT portion and a test of the FWD portion in succession by switching a test circuit connected to the RC-IGBT chip in a state in which contact probes are in contact with electrodes of the RC-IGBT chip,
wherein
performing the test of the IGBT portion includes performing at least one of a turn on/off test, an avalanche test, or a short-circuit test, and performing the test of the FWD portion includes performing a recovery test,
performing the turn on/off test includes connecting to the RC-IGBT chip an IGBT characteristic test load including a circuit made up of a first coil and a first diode connected in parallel and a snubber circuit at the time of the turn on/off test;
performing the avalanche test includes connecting to the RC-IGBT chip the IGBT characteristic test load including the first coil and the snubber circuit at the time of the avalanche test of the IGBT portion;
performing the short-circuit test includes connecting a power supply to the RC-IGBT chip at the time of the short-circuit test, and
performing the recovery test includes connecting to the RC-IGBT chip a FWD characteristic test load including a circuit made up of a second coil and a second diode connected in parallel and a capacitor for suppressing fluctuations in the power supply at the time of the recovery test.

21. The semiconductor test method according to claim 20, wherein the turn on/off test of the IGBT portion, the avalanche test of the IGBT portion, the recovery test of the FWD portion, and the short-circuit test of the IGBT portion are performed in that order.

* * * * *

UNITED STATES PATENT AND TRADEMARK OFFICE
CERTIFICATE OF CORRECTION

PATENT NO. : 10,996,260 B2
APPLICATION NO. : 16/175075
DATED : May 4, 2021
INVENTOR(S) : Mitsuru Yoshida Page 1 of 1

It is certified that error appears in the above-identified patent and that said Letters Patent is hereby corrected as shown below:

In the Claims

Column 18, Line 4:
In Claim 20, delete "test of the IGBT portion;" and insert -- test; --, therefor.

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*